United States Patent [19]

Hackett, Jr.

[11] 4,275,286

[45] Jun. 23, 1981

[54] PROCESS AND MASK FOR ION BEAM ETCHING OF FINE PATTERNS

[75] Inventor: Le Roy H. Hackett, Jr., Malibu, Calif.

[73] Assignee: Hughes Aircraft Company, Culver City, Calif.

[21] Appl. No.: 965,964

[22] Filed: Dec. 4, 1978

[51] Int. Cl.³ .................. B23K 15/00; C23F 1/02; C23C 15/00; H01L 21/302
[52] U.S. Cl. .................. 219/121 EK; 219/121 EM; 219/121 EE; 219/121 ER; 219/121 LJ; 219/121 LP; 156/643; 204/192 EC; 204/192 N; 427/35; 427/91
[58] Field of Search .............. 219/121 EM, 121 LM, 219/121 EB, 121 L, 121 EJ, 121 EK, 121 EE, 121 ER, 121 LH, 121 LJ, 121 LP; 204/192 N, 192 E, 192 EC; 156/643; 427/35, 88, 91, 99

[56] References Cited

U.S. PATENT DOCUMENTS

| Re. 29,947 | 3/1979 | Van Ommeren | 204/192 E |
|---|---|---|---|
| 3,834,792 | 9/1974 | Janning | 350/341 |
| 3,860,783 | 1/1975 | Schmidt et al. | 219/121 EM |
| 3,956,052 | 5/1976 | Koste et al. | 219/121 LM X |
| 3,988,564 | 10/1976 | Garvin et al. | 219/121 EM |
| 3,997,378 | 12/1976 | Kaji et al. | 427/88 X |
| 4,004,044 | 1/1977 | Franco et al. | 204/192 E X |
| 4,057,831 | 11/1977 | Jacobs et al. | 204/192 EC X |
| 4,076,575 | 2/1978 | Chang | 204/192 EC X |
| 4,092,210 | 5/1978 | Hoepfner | 219/121 LM X |
| 4,098,917 | 7/1978 | Bullock et al. | 156/643 X |
| 4,117,301 | 9/1978 | Goel et al. | 219/121 EM |
| 4,128,467 | 12/1978 | Fischer | 204/192 E |
| 4,145,459 | 3/1979 | Goel | 427/88 |
| 4,153,529 | 5/1979 | Little et al. | 204/192 E X |

OTHER PUBLICATIONS

Hatzakis et al., "Forming a Sputter-Etching Mask", IBM Tech. Disc. Bull., vol. 12, No. 11, Apr. 1970, p. 1945.
Blakeslee et al., "Aluminum Etch Mask for Plasma Etching", IBM Tech. Disc. Bull., vol. 21, No. 3, Aug. 1978, pp. 1256-1258.
Hosaka et al., "Influence of Sample Inclination and Rotation During Ion-Beam Etching on Ion-Etched Structures", J. Vac. Sc. Techol., 15(5), Sep./Oct. 1978, pp. 1712-1717.

Primary Examiner—C. L. Albritton
Assistant Examiner—E. F. Borchelt
Attorney, Agent, or Firm—Mary E. Lachman; W. H. MacAllister

[57] ABSTRACT

The specification describes a process for ion beam etching fine patterns in a substrate using a protected resist mask which prevents erosion of the mask. First, a resist pattern is formed on the surface of a substrate to expose pre-selected areas of the substrate. Next, a selected material is deposited on the resist mask at a predetermined controlled angle of incidence with respect to the surface of the mask to form a relatively thin protective layer on the resist mask, having edges and patterns replicated from the edges and patterns of the resist mask and a negligible amount of the selected material deposited on the exposed substrate. Then, a beam of ions at a chosen energy is directed through openings in the protected mask to the substrate to etch the pre-selected areas. During etching, the protective layer on the resist prevents erosion of the resist mask and provides improved pattern definition for the etched region. In a preferred embodiment, metal contacts to the etched regions are subsequently formed by depositing a selected metal from a directional source and then lifting off the resist and the undesired metal.

11 Claims, 16 Drawing Figures

PROCESS AND MASK FOR ION BEAM ETCHING OF FINE PATTERNS

FIELD OF THE INVENTION

This invention relates generally to an ion beam etching process and mask and more particularly to an ion beam etching process using a protected resist mask which provides improved pattern definition so that fine, deep patterns may be etched and so that improved metal patterns may be formed in the regions so etched.

BACKGROUND OF THE INVENTION

In the fabrication of integrated circuitry, increased miniaturization of electronic devices is an important goal. In the fabrication of thin film integrated optic components, such as light guides, modulators, directional couplers, and polarizers, high resolution pattern formation of submicrometer size is required, as well as high quality edge smoothness of the pattern. In order to decrease the size of the devices, one key step in the fabrication of these small geometry devices such as field-effect transistors, for example, is the accurate and precise definition of the patterns used to define gate, source, or drain regions or to define metal contact areas thereto. Using known processes, a photoresist pattern is defined on the surface of a substrate or a layer formed thereon, as described by William S. DeForest in the book entitled, "Photoresist Materials and Processes," McGraw-Hill Book Company, New York, 1975. Then, a chemical etchant which is specific for the substance to be removed is applied through openings in the photoresist pattern to etch selected regions of the substrate or layer formed on the substrate. Chemical etching has, however, several disadvantages, one of which is to cause delamination of the resist by attacking the resist-substrate interface and thus causing a loss of edge definition of the resist pattern and less precise definition of the etched pattern. In some cases, the etchant required for the material to be removed would chemically attack and destroy the photoresist material. In addition, in chemical etching, lateral etching of the substrate, or undercutting, can occur, in which portions of the substrate which it was desired to maintain are etched away, thus interfering with the formation of the desired structure.

In order to alleviate some of the problems associated with the use of chemical etchants, an energetically controlled beam of ions has been used to etch a surface through a patterned mask, as disclosed in U.S. Pat. Nos. 3,860,783, and further in 3,988,564, the latter being assigned to the present assignee. The patterns produced by ion beam etching are more sharply defined than those produced by chemical etching and the quality of the pattern definition and therefore the performance of the resulting device are improved. Ion beam etching is the result of a transfer of momentum between the incident ions and the target atoms, in which the surface atoms of the target are imparted with sufficient energy to allow them to escape from the surface. For given conditions of incident ion species and bombardment energy, different materials are etched at different rates, which have been related, at least in part, to atomic numbers. (See N. Laegreid and G. K. Wehner, *Journal of Applied Physics,* Vol. 32, p. 365 (1961).) The formation of stable compounds, such as oxides or nitrides, on the surface of the target has been found to reduce the ion beam etching rate at these surfaces. When a target is etched by an ion beam which is applied through openings in a resist mask to the target, molecules of the resist as well as molecules of the target are etched. Thus, it is necessary in order to maintain the desired pattern, to provide an initial resist layer of sufficient thickness that some resist will remain when the target material has been etched to the desired depth. As the resist is etched during the ion beam etching process, however, the sharpness of the resist pattern deteriorates, i.e., the edge profile of the openings in the resist is not maintained. In addition, the deeper the substrate is etched, the more severe is the erosion of the resist pattern.

This problem of resist erosion is of particular importance where the resist used as the ion beam etching mask remains in place to further serve as a mask for metal deposition to establish metal contacts to the device. The resist profile is of primary importance to the function of defining metal patterns with respect to edge quality and the thickness attainable. When the resist pattern becomes eroded during the course of a prior art ion beam etching process, the edges of the resist pattern at the top surface take the form of gradually sloped walls, rather than a sharp edge approximating 90°. When metal is subsequently deposited over this photoresist, the metal conforms to the shape of photoresist layer and forms a continuous layer over the top surface of the photoresist, the sloping walls of the photoresist which lie on either side of the etched region of the target, and the bottom surface of the etched region of the target. A metal layer of this configuration has structural strength and uniformity of coverage which cause difficulty during lift-off procedures when the resist is dissolved and the unwanted metal is removed with the resist. In some cases, the undesired metal must actually be torn away from the desired metal. Naturally, the thicker the layer of metal which is deposited, the greater the strength of the layer and the more severe the problem at lift-off. Thus, by prior art processes, the thickness of the deposited metal layer is limited.

SUMMARY OF THE INVENTION

The general purpose of this invention is to provide a new and improved ion beam etching process and mask which possess most, if not all, of the advantages of the prior art processes while alleviating their significant disadvantages discussed above.

In order to accomplish the above-described general purpose of this invention, I have discovered and developed a new and improved process for ion beam etching fine pre-selected areas in a chosen target by first forming on the surface of the target a resist mask that has openings that expose the pre-selected areas in the target. Next, a selected material, which ion beam etches more slowly than the target and which can be deposited at a temperature which is below the flowing temperature of the deposited resist, is deposited onto the mask at a predetermined controlled angle of incidence with respect to the surface of the mask to form a relatively thin protective layer on the resist mask and with edges and patterns replicated from the edges and patterns of the resist mask and with a negligible amount of the selected material deposited on the target. Finally, a beam of chosen ions at a chosen energy is directed through openings in the protected mask to the target to etch the pre-selected areas in the target. During the ion beam etching of the target, the protective layer on the resist prevents or substantially impedes erosion of the resist mask. In a preferred embodiment of the present invention, pre-selected areas are etched in a target as described above and then with the protected mask still in place, metal contacts are formed to the pre-selected areas. Finally, a selected solvent is applied to dissolve the resist away from the surface of the target and thus remove the portion of the metal adhering to the resist.

Accordingly, it is an object of the present invention to provide a new and improved process for ion beam etching fine patterns in a target.

Another object is to provide a process of the type described in which the patterned openings etched are relatively deep as well as of fine width.

Still another object is to provide a resist mask for ion beam etching in which the erosion of the mask during ion beam etching of the target is prevented or substantially impeded so that the resist pattern maintains sharp definition.

A further object is to provide a combination resist and metal mask of the type described which is suitable for use as both an ion beam machining (etching) mask and a metal pattern definition mask.

Still another object of the present invention is to provide a new and improved process for ion beam etching fine patterns in a target and then establishing metal contacts to the etched regions.

Another object is to provide a process of the type described above in which a fine pattern is etched in a target and is coincident with and of the same lateral dimension as the metal contact to be subsequently formed.

Yet another object is to provide a process of the type described above in which the metal lift-off procedure is simplified and the edges of the metal contacts so formed are smooth and well-defined.

Still another object is to provide a process of the type described above in which the metal contacts may be formed to a greater thickness than was previously available with ease.

These and other objects and advantages of the present invention will become more readily apparent in the following description of the drawings and preferred embodiments of the invention.

DETAILED DESCRIPTION OF THE INVENTION

Figure 1:
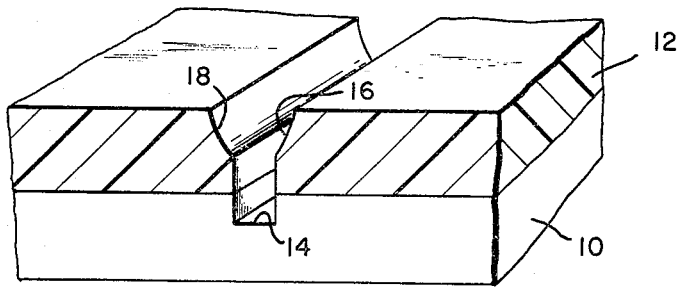
FIG. 1 illustrates, in isometric and schematic cross-section, the structure which results from ion beam etching by conventional processes.

FIG. 1 shows the structure which results from a conventional ion beam etching process. A substrate 10 with a resist pattern 12 deposited thereon has been subjected to ion beam etching to form a channel 14 in the substrate 10. As a result of the ion beam etching, as discussed above, the edges of the resist pattern have been eroded to form the sloped walls 16 and 18. The deeper the channel 14 etched in the substrate 10, the more severe the erosion of the resist pattern and the longer the sloped walls 16 and 18 become.

Figure 2:
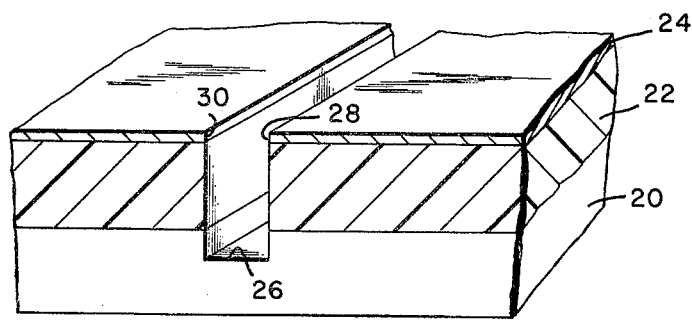
FIG. 2 illustrates, in isometric and schematic cross-section, the structure which results from ion beam etching in accordance with the present invention.

FIG. 2 shows the structure which results from ion beam etching in accordance with the present invention. A substrate 20 has a resist pattern 22 deposited thereon and a similarly patterned metal layer 24 deposited at a small controlled angle onto the resist pattern 22. The structure has been subjected to ion beam etching to form a channel 26 in the substrate 20. After ion beam etching, the edges of the resist pattern maintain their sharp edges 28 and 30. Deeper etching of the channel 26 in the substrate 20 does not appreciably affect the edges of the resist pattern as long as a sufficiently thick protective layer has been formed, as discussed for FIG. 5, and deep etching may be readily performed. Thus, the process of the present invention overcomes the disadvantages of the prior art discussed in FIG. 1 and is particularly suited to etching fine, deep patterns in a substrate.

Figure 3:
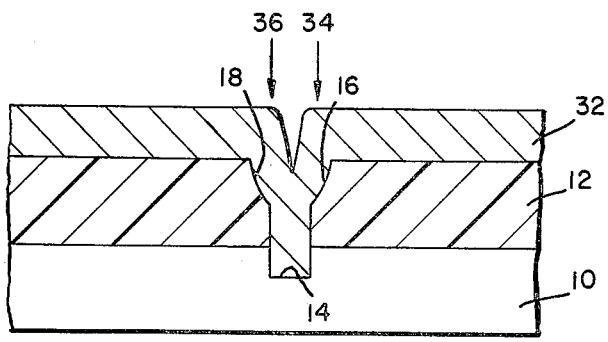
FIG. 3 shows, in schematic cross-section, the configuration of a metal layer deposited after a conventional ion beam etching process.

FIG. 3 shows the configuration of a metal layer deposited after conventional ion beam etching as described in FIG. 1. The substrate 10 with the resist pattern 12 has a layer 32 of metal deposited on the surface and the sloping walls 16 and 18 of the resist pattern 12 and into the etched region 14 of the substrate 10. Because of the structural strength and uniformity of coverage of this continuous metal layer 32, when the resist layer 12 is dissolved for lifting off the metal deposited on top of the resist pattern 12, the metal layer 32 must be torn apart along the lines indicated by arrows 34 and 36. This tearing results in a ragged edge along the lines indicated by arrows 34 and 36 for the metal which remains after lift-off. Also the thickness of the metal layer is limited to a thickness which can be torn or cleaved during the lift-off process. In addition, during lift-off, the metal layer 32 may be torn away from the substrate within the etched region 14, thus preventing the formation of the desired metal contact to the etched region 14.

Figure 4:
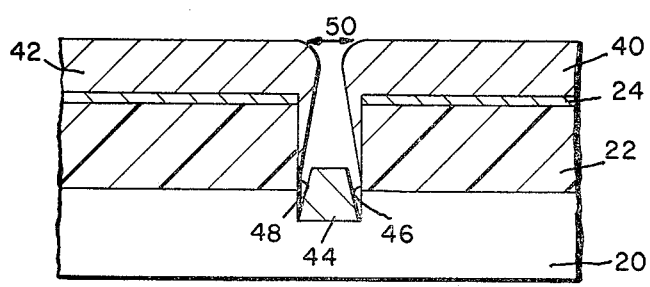
FIG. 4 shows, in schematic cross-section, the configuration of a metal layer deposited in accordance with the present invention.

FIG. 4 shows the configuration of a metal layer deposited after ion beam etching, in accordance with the present invention, as described in FIG. 2. The substrate 20 with the resist pattern 22 and the thin metal layer 24 formed by deposition at a controlled small angle, is exposed to a metal deposition system which is highly directional, such as filament evaporation or electron-beam evaporation, and in which the metal source is normal to the plane of the resist. The metal is deposited as shown in FIG. 4 in regions 40, 42, and 44. There are discontinuities in the metal layer at points 46 and 48 and 50, where no metal is deposited. Thus, when the resist is dissolved to lift off the metal regions 40 and 42, lift-off occurs easily because neither the region 40 nor the region 42 is connected to the metal contact region 44 which it is desired to leave intact. Since there is no tearing of the metal layer as in the prior art discussed in FIG. 3, the edges of the metal region 44 remaining after the lift-off process are smooth and well-defined. In addition, using the process of the present invention, the metal layer 44 can be formed to a greater thickness than by prior art methods since there is no need to limit the thickness of the metal layer to a thickness which can be torn or cleaved as discussed in FIG. 3. The limitation on the thickness of the metal layer 40, 42, or 44 would be the thickness at which the discontinuities 46, 48, and 50 can be maintained. Thus, smoother-edged and thicker metal contacts can be formed by the process of the present invention that by the prior art discussed in FIG. 3.

Figure 5A:
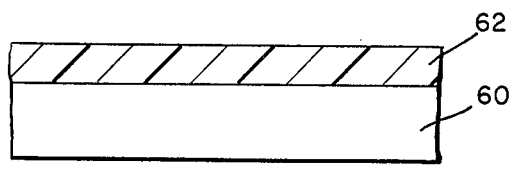
FIGS. 5a-5e illustrate, in schematic cross-section, some of the major steps in the process of the present invention, for ion beam etching fine patterns in a target.
Figure 5B:
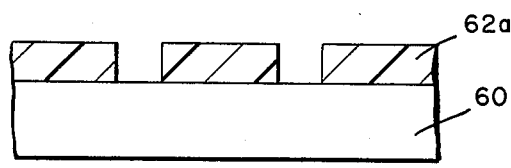
Figure 5C:
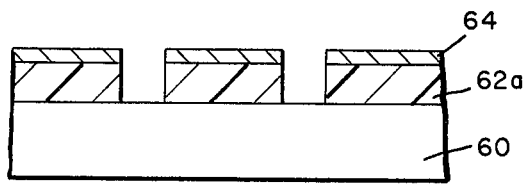
Figure 5D:
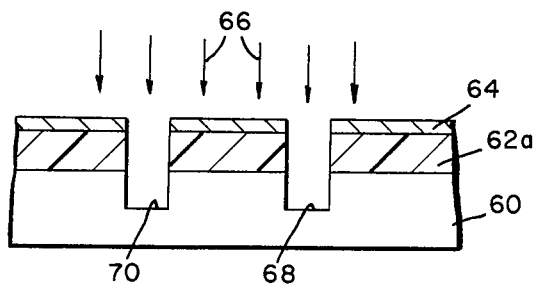
Figure 5E:
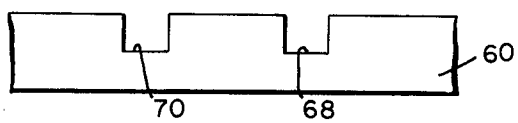

Turning now to FIG. 5, there is shown in FIG. 5a a substrate 60, such as a wafer of gallium arsenide or silicon, upon which has been deposited a layer 62 of a resist material of predetermined thickness. For example, the resist may be polymethylmethacrylate, which is deposited to a thickness of 5000Å, by well-known spin coating techniques wherein, for example, a plurality of gallium arsenide substrates are mounted on a suitable support table, provided with a few drops of the resist solution and then rotated with circular rotational speed sufficient to centrifugally spin the resist solution uniformly and radially across the upper surface of the substrates. Next, using known lithographic procedures, the resist is exposed through a mask to radiation or by electron beams radiation and then developed to form the desired resist pattern 62a shown in FIG. 5b. In the case of polymethylmethacrylate, the resist is exposed to an electromagnetically positioned beam of electrons, subsequently developed with methylisobutylketone, and dried with nitrogen. Then, the structure of FIG. 5b is placed in a substrate holder which is placed in an evaporation apparatus containing a point source of evaporation and the surface of the resist pattern 62a is oriented at a chosen angle of incidence between 2° and 20° with respect to the point source. The material selected for evaporation must be one which ion beam etches at a slower rate than the substrate in order to protect the substrate. For example, for a given set of ion beam etching conditions, gallium arsenide etches at the rate of 2600Å per minute, while aluminum etches at a rate of 450Å per minute. Thus, 500Å of aluminum would be sufficient to protect an underlying resist profile during the removal of approximately 2500Å of gallium arsenide. In addition, the material selected for evaporation must be capable of being deposited at a temperature which is lower than the flowing temperature of the resist in order to prevent the resist from flowing together and losing the established geometry. As is discussed further for FIG. 7, evaporation must be from a point source and at a specified angle in order to deposit a protective layer on the resist mask which replicates the edges and patterns of the resist mask, while having a negligible amount of the selected material deposited on the substrate to be etched. Electron beam evaporation and filament evaporation, both of which are well-known processes, as described in "Handbook of Thin Film Technology," edited by L. Maissel and R. Glang, McGraw-Hill Book Company, 1970, are suitable point source evaporation processes. If, for example, the selected protective material is aluminum, it would be deposited by vacuum evaporation to a thickness of 500Å to 1000Å. The appropriate angle of incidence is discussed below with respect to FIG. 7. In addition to aluminum, other metals such as magnesium, chromium, and titanium, which are easily oxidized in air are particularly useful as protective layers. As has been previously pointed out, it has been found that the formation of a stable compound, such as an oxide or nitride, on the surface of a target reduces the ion beam etching rate at the target surface. After the protective layer 64 of FIG. 5c has been deposited on the resist pattern 62a, the structure is exposed to a beam of ions, such as argon, neon, krypton, or xenon, indicated by arrows 66 in FIG. 5d, at a predetermined energy and exposure time, to etch away regions 68 and 70 of FIG. 5d from the substrate 60. The etched regions 68 and 70 may be from 10Å to 10,000Å deep, depending on the thickness of the protective layer. For example, argon ions at 0.5 Kev and applied for 6.5 minutes may be used to etch a gallium arsenide substrate to a depth of 500Å, using 5000 Å of resist and 500Å of an aluminum protective layer. During etching, the substrate is cooled, for example, by being greased to a water-cooled heat sink, in order to avoid elevated temperatures which would affect the stability of the resist pattern. As indicated in FIG. 5d, the thickness of the protective layer 64 has been reduced by the ion beam etching, but a portion of the protective layer 64 still remains after ion beam etching has beem completed. The greater the thickness of the protective layer which is used, the deeper the substrate can be etched before the protective layer is etched away. After the ion beam etching process has been completed, the structure of FIG. 5d is subjected to etching with a selected chemical for a brief period of time, in order to remove the portions of the substrate 60 which lie immediately below the etched regions 68 and 70 and which have suffered crystal damage from the ion bombardment during ion etching. Finally, a solvent such as trichlorethylene or acetone is applied to the structure of FIG. 5d to dissolve the resist pattern 62a away from the substrate 60, carrying with it the protective layer 64. The resulting structure shown in FIG. 5e consists of substrate 60 with fine, deep etched regions 68 and 70, and could be used as a ridged optical waveguide, an optical grating coupler or an optical filter as discussed in U.S. Pat. No. 4,049,944, assigned to the present assignee.

In FIG. 6 there is shown another embodiment of the present invention in which a fine pattern is ion beam etched into a layer deposited on a substrate in a manner similar to the ion beam etching described in FIG. 5, and metal contact is subsequently formed to the etched regions. In FIG. 6a, there is shown a substrate 60, such as gallium arsenide, with an active layer 61 formed thereon. Layer 61 may be the active region in a device such as a field-effect transistor and may be deposited as a separate layer on the substrate 60 or may be formed by ion implantation or diffusion of a selected substance into the substrate 60, both of which processes are well-known in the art of fabricating devices such as field-effect transistors. A layer 62 of a resist material is deposited over the surface of the active layer 61 to a predetermined thickness, as shown in FIG. 6a. Next, using known lithographic procedures, the resist is exposed through a mask to radiation or by electron beam radiation and then developed to form the desired resist pattern 62a shown in FIG. 6b. Then, the structure of FIG. 6b is exposed to evaporation from a point souce at a chosen angle of incidence as described for FIG. 5b, to form the protective layer 64 deposited on the resist pattern 62a, as shown in FIG. 6c. The structure of FIG. 6c is exposed to a beam of ions, such as argon, indicated by arrows 66 in FIG. 6d, at a predetermined energy and exposure time to etch away regions 72 and 74 in the active layer 61, as indicated in FIG. 6d. Next, the structure of FIG. 6d is subjected to a brief chemical etch to remove crystal-damaged regions underlying the etched regions 72 and 74. Then, the structure is placed in a metal deposition system which is highly directional (i.e. electron beam evaporation or filament evaporation) with the source of evaporation normal to the target structure. The metal deposits in the configuration shown in FIG. 6e as layers 76, 78 and 79 and is explained in more detail in the discussion of FIG. 4. If the metal thus deposited is the same metal as was used for the protective layer 64, then layers 64 and 76 indicated in FIG. 6e are one continuous layer. If aluminum was deposited as layer 64, then further aluminum would be deposited until layer 76 had the desired thickness. It is possible, however, to deposit different substances for layers 64 and 76. For example, the protective layer 64 might be $SiO_x$ and the metal deposited as layers 76, 78, and 79 might be gold, chromium-gold, or chromium-palladium-gold. Finally, a solvent such as trichlorethylene or acetone is applied to the structure of FIG. 6e to dissolve the resist pattern 62a away from the active layer 61. The resist pattern 62a thus removed carries with it the layers 64 and 76 which had been deposited above the resist pattern 62a. The resulting structure shown in FIG. 6f consists of the substrate 60 and the active layer 61 which has fine, deep etched regions 72 and 74 having metal contacts 78 and 79 respectively formed therein. The structure of FIG. 6f finds utility in a dual-gate structure such as a dual-gate field-effect transistor device which would have source and drain regions defined on either side of the gates. The process of the present invention is particularly suited to fabricating field-effect transistor devices which require gates of fine geometry, with vertical walls and which are coincident with the deposited metal.

Figure 7:
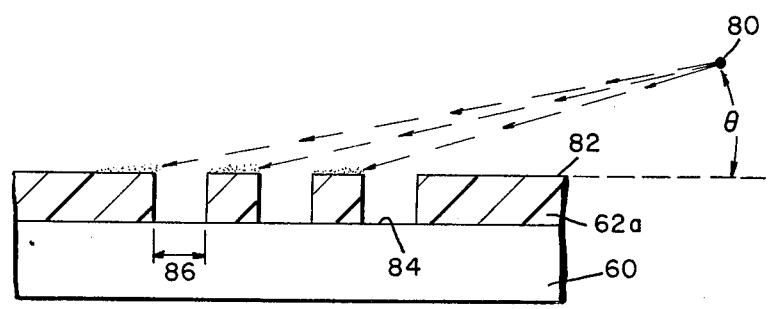
FIG. 7 illustrates, in schematic cross-section, a preferred means for depositing a protective layer on a patterned resist in accordance with the present invention.
Figure 6A:
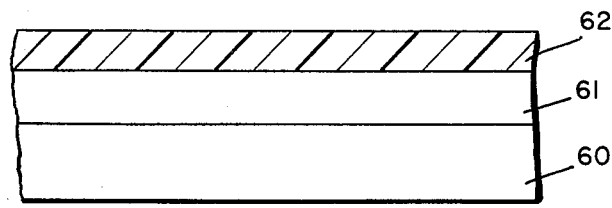
FIGS. 6a-6f illustrate, in schematic cross-section, some of the major steps in the process of the present invention for ion beam etching fine patterns in a target and subsequently forming metal contacts to the etched regions.
Figure 6B:
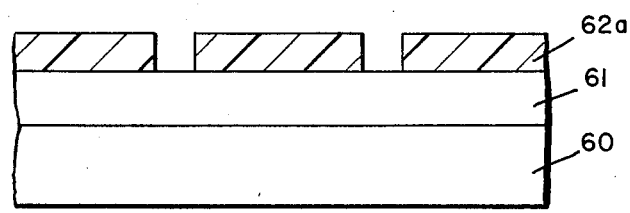
Figure 6C:
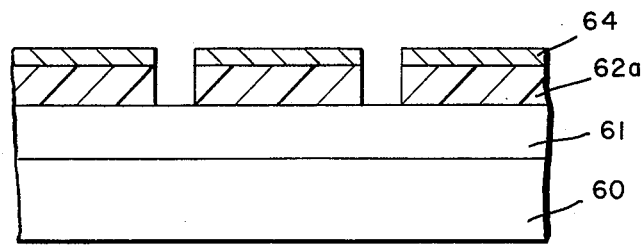
Figure 6D:
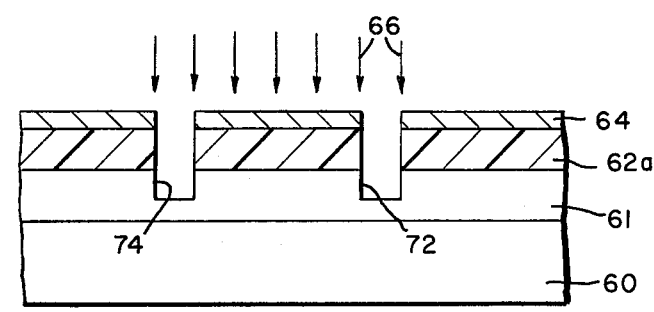
Figure 6E:
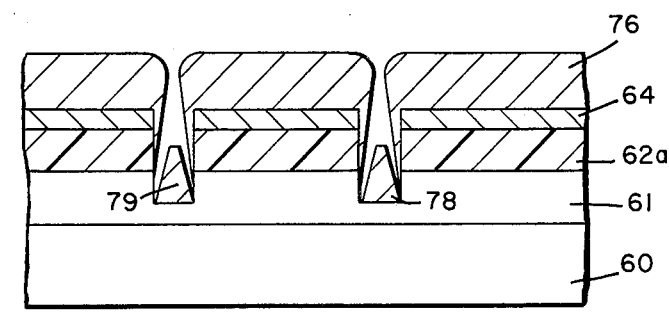
Figure 6F:
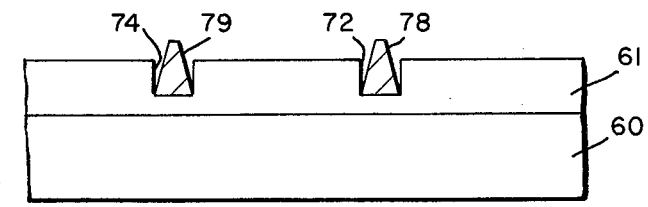

Considering now FIG. 7, there is shown a preferred means for depositing the protective layer on the resist pattern as discussed above for FIG. 5c. The substrate 60 shown in FIG. 7 having a resist pattern 62a deposited thereon is placed in an evaporation apparatus containing a point source 80 of evaporation at a distance of 4 to 20 inches from the source 80. The structure is oriented so that there is a low angle of incidence $\theta$ from the point source 80 to the surface 82 of the resist pattern 62a. A point source of evaporation must be used so that the direction of the evaporated atoms can be controlled. The low angle of incidence $\theta$ from the point source 80 to the surface 82 is necessary so that the protective layer can be deposited on the surface 82 of the resist without being deposited on the surface 84 of the substrate 60 which is exposed by the resist pattern. The closer the angle of incidence $\theta$ approaches to 90 degrees, the greater is the likelihood that deposition will occur on the surface 84 as well as the surface 82. The structure must be oriented so that there is not a line of sight from the evaporation source to any part of the substrate. The angle of incidence $\theta$ which is used depends in part on the width 86 of the openings in the resist pattern 62a. The smaller the width 86, the larger the angle of incidence which may be used. The following are some typical angles of incidence $\theta$ for various resist opening widths in the direction of evaporation in a 1 micrometer thick resist.

| Maximum Angle of Incidence | Maximum Resist Opening Width |
|---|---|
| 2° | 28.6 micrometers |
| 5° | 11.4 micrometers |
| 10° | 5.7 micrometers |
| 20° | 2.8 micrometers |

Smaller resist opening widths than those listed above can easily be accommodated by the present invention since the required angle of incidence can be relatively large. Since an angle of incidence of less than 2 degrees is difficult to obtain in practice, the present invention would probably find limited use for resist opening widths in excess of 28.6 micrometers. The angle of incidence $\theta$ also depends on the thickness of the resist pattern 62a. The thinner the resist pattern 62a which is used, the smaller the angle of incidence $\theta$ which must be used in order to avoid depositing metal on the exposed surface 84 of the substrate 60. Thus, the angle of incidence which is used must take into consideration both the resist opening width and the resist thickness. During deposition of the protective layer, the deposition temperature is controlled so that the temperature at the surface of the target does not exceed the flowing temperature of the resist pattern 62a. The source is maintained at the temperature required to melt the source material and to establish a reasonable rate of deposition.

While the present invention has been particularly described with respect to a preferred sequence of process steps to ion beam etch fine patterns in a substrate, it will be understood that the invention is not limited to the particular process steps, their sequence, or the final structures depicted in the drawings. On the contrary, it is intended to cover all alternatives, modifications, and equivalents as may be included within the spirit and scope of the invention defined by the appended claims. In particular, the scope of the invention is intended to encompass ion beam etching of any suitable material including semiconductor, insulating, and photodetector materials, and includes the etching of openings into a substrate as well as the etching of openings into a layer of material deposited on the surface of a substrate. In addition, any resist material which meets the requirements set forth herein may be used and may be a photoresist or a resist which is sensitive to electron beams, ion beams, or X-rays. Further, it is intended to include resist patterns formed by either contact or off-contact lithographic processes.

What is claimed is:
1. A process for ion beam etching in a chosen target fine pre-selected areas having walls substantially perpendicular to the surface of said target, comprising the steps of:
    (a) providing said target;
    (b) forming a resist mask on the surface of said target and having openings therein which expose said pre-selected areas of said target;
    (c) depositing a selected material which ion beam etches more slowly than said target and which is capable of being deposited at a temperature which is lower than the flowing temperature of said resist, onto said mask at a predetermined controlled angle of incidence with respect to the surface of said resist mask to form a relatively thin protective layer on said resist mask, said predetermined controlled angle of incidence being an acute angle sufficient to deposit said layer with edges and pat- terns replicated from edges and patterns in said resist mask and with a negligible amount of said selected material deposited on said target; and (d) directing a beam of chosen ions at a chosen energy through openings in said protected resist mask to said target to etch said pre-selected areas in said target wherein said thin protective layer prevents or substantially impedes the erosion of said resist mask during said ion beam etching of said target and said pre-selected areas are ion beam etched with said walls substantially perpendicular to said target.

2. A process as set forth in claim 1 wherein said target is chosen from the group consisting of a substrate and a substrate having a chosen layer deposited thereon.

3. A process as set forth in claim 1 wherein said selected material is chosen from the group consisting of aluminum, magnesium, chromium, and titanium.

4. A process as set forth in claim 1 wherein said chosen ions are selected from the group consisting of argon, neon, krypton, and xenon.

5. A process as set forth in claim 1 wherein said fine pre-selected areas are etched to a depth of between 10A and 10,000A.

6. A process as set forth in claim 1 wherein:
(a) said target is a gallium arsenide substrate;
(b) said resist is polymethylmethacrylate and is deposited to a thickness of 5000A;
(c) said selected material is aluminum and is deposited to a thickness of 500A;
(d) said chosen ions are argon ions at 0.5 Kev energy and are applied for 6.5 minutes; and
(e) said etching of said target is performed to a depth of 800A.

7. In a process for ion beam etching selected areas in a target which comprises providing said target, forming a patterned resist mask on the surface of said target to expose said selected areas in said target, and directing a beam of chosen ions through openings in said resist mask to said target, the improvement comprising evaporating a selected material which ion beam etches more slowly than said target and at a temperature which is lower than the flowing temperature of said resist, onto said resist mask at a predetermined controlled angle of incidence with respect to the surface of said resist mask to form a relatively thin protective layer on said resist mask, said predetermined controlled angle of incidence being an acute angle sufficient to deposit said layer with edges and patterns replicated from edges and patterns in said resist mask and with a negligible amount of said selected material deposited on said target wherein said protective layer prevents or substantially impedes the erosion of said resist mask during said ion beam etching of said target and said selected areas are formed by said ion beam etching to have walls substantially perpendicular to said surface of said target.

8. A process for ion beam etching fine pre-selected areas in a chosen target and forming metal contacts to said areas comprising the steps of:
(a) providing said target;
(b) forming a resist mask on the surface of said target and having openings therein which expose said pre-selected areas of said target;
(c) depositing a selected material which ion beam etches more slowly than said target and which is capable of being deposited at a temperature which is lower than the flowing temperature of said resist, onto said mask at a predetermined controlled angle of incidence with respect to the surface of said resist mask to form a relatively thin protective layer on said resist mask, said predetermined controlled angle of incidence being an actue angle sufficient to deposit said layer with edges and patterns replicated from edges and patterns in said resist mask and with a negligible amount of said selected material deposited on said target;
(d) directing a beam of chosen ions at a chosen energy through openings in said protected resist mask to said target to etch said pre-selected areas in said target wherein said thin protective layer prevents or substantially impedes the erosion of said resist mask during said ion beam etching of said target and said pre-selected areas are ion beam etched to have walls substantially perpendicular to said surface of said target;
(e) depositing a selected metal from a directional source normal to the surface of said protected resist mask and into contact with said etched preselected areas in said target; and
(f) applying a selected solvent to dissolve said resist away from the surface of said target and to thereby remove the portion of said metal adhering to said resist.

9. A process as set forth in claim 8 wherein:
(a) said target is a gallium arsenide substrate;
(b) said resist is polymethylmethacrylate and is deposited to a thickness of 5000A;
(c) said selected material is aluminum and is deposited to a thickness of 500Å;
(d) said chosen ions are argon ions at 0.5 Kev energy and are applied for 6.5 minutes;
(e) said etching of said target is performed to a depth of 800Å; and
(f) said selected metal is aluminum and is deposited to a thickness of 2500Å.

10. A process for making a protected ion beam etching mask which includes:
(a) providing a resist mask on the surface of a chosen substrate and having openings therein which expose pre-selected areas on said substrate to be ion beam etched; and
(b) depositing a selected material onto said resist mask at a predetermined controlled angle of incidence with respect to the surface of said resist mask to thereby form a thin protective layer on said resist mask, said predetermined controlled angle of incidence being an acute angle sufficient to deposit said layer with edges and patterns replicated from edges and patterns in said resist mask, wherebya negligible amount of said selected material reaches said substrate and said thin protective layer prevents or substantially impedes any erosion of said resist mask during the ion beam etching of said substrate.

11. The process defined in claim 10 where said depositing a selected material includes projecting aluminum onto said resist mask from a point source and at a chosen angle of incidence with respect to said surface of said resist mask of between 2° and 20° to thereby form a thin aluminum film on said resist mask of the order of 500Å or greater, and said chosen angle being determined, in part, by the width of said openings in said resist mask.

* * * * *